(12) United States Patent
Hahn et al.

(10) Patent No.: US 9,622,378 B2
(45) Date of Patent: Apr. 11, 2017

(54) RECIRCULATING COOLING UNIT WITHIN A HOUSING

(71) Applicant: ABB Technology Ltd, Zürich (CH)

(72) Inventors: Robert Hahn, Hjärup (SE); Krister Landén, Löddeköpinge (SE); Lars Larsson, Rydebäck (SE); Martin Nilsson, Asmundtorp (SE); Meho Mehmedovic, Hyllinge (SE)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 14/649,121

(22) PCT Filed: Dec. 4, 2012

(86) PCT No.: PCT/EP2012/074347
§ 371 (c)(1),
(2) Date: Jun. 2, 2015

(87) PCT Pub. No.: WO2014/086395
PCT Pub. Date: Jun. 12, 2014

(65) Prior Publication Data
US 2015/0319884 A1    Nov. 5, 2015

(51) Int. Cl.
| F28D 15/00 | (2006.01) |
| H05K 7/20 | (2006.01) |
| F24F 13/20 | (2006.01) |
| F24F 1/00 | (2011.01) |
| F24F 5/00 | (2006.01) |

(52) U.S. Cl.
CPC ........... *H05K 7/20272* (2013.01); *F24F 1/00* (2013.01); *F24F 5/0003* (2013.01); *F24F 13/20* (2013.01); *F24F 2013/207* (2013.01); *F24F 2221/36* (2013.01)

(58) Field of Classification Search
CPC   H05K 7/20218; H05K 7/20272; F25B 45/00; F24F 5/0003; F24F 13/20; F24F 1/00; F24F 2013/207; F24F 2221/36
USPC ............ 165/104.31; 62/118, 119, 259.1
See application file for complete search history.

(56) References Cited

U.S. PATENT DOCUMENTS

| 3,029,612 A * | 4/1962 | Victor | ............ D06F 43/02 236/93 A |
| 3,205,674 A * | 9/1965 | Arnold | ............ F25D 19/04 62/180 |
| 3,299,657 A * | 1/1967 | Malkoff | ............ F24F 1/02 62/183 |

(Continued)

FOREIGN PATENT DOCUMENTS

| CA | 2 349 109 A1 | 11/2002 |
| EP | 1 107 288 A2 | 6/2001 |

(Continued)

*Primary Examiner* — Len Tran
*Assistant Examiner* — Claire Rojohn, III
(74) *Attorney, Agent, or Firm* — Birch, Stewart, Kolasch & Birch, LLP

(57) ABSTRACT

A recirculating cooling unit includes a plurality of components which require supervision and maintenance. The interior of the cooling unit includes an open space, named a service area, designed to house a human working in the space, and the components are arranged so that they are accessible from the service area, and the cooling unit is provided with an opening design to allow a human to enter into the cooling unit and to enter the service area.

4 Claims, 2 Drawing Sheets

(56) References Cited

U.S. PATENT DOCUMENTS

| | | | | |
|---|---|---|---|---|
| 3,729,950 A | * | 5/1973 | Astrom | F24F 13/20 62/259.1 |
| 4,487,023 A | * | 12/1984 | Hegadorn | A23G 9/20 62/1 |
| 4,955,585 A | | 9/1990 | Dickerson | |
| 6,463,748 B1 | * | 10/2002 | Benedict | F04D 27/0284 62/228.1 |
| 7,681,410 B1 | * | 3/2010 | Bean, Jr. | F25D 16/00 361/699 |
| 2004/0256773 A1 | | 12/2004 | Dry et al. | |
| 2007/0000280 A1 | | 1/2007 | Hinder et al. | |
| 2009/0309275 A1 | | 12/2009 | Loiacono | |
| 2010/0115989 A1 | * | 5/2010 | Chrysostomou | C02F 1/22 62/541 |
| 2012/0125023 A1 | * | 5/2012 | Kopko | F25B 25/005 62/113 |

FOREIGN PATENT DOCUMENTS

| | | |
|---|---|---|
| GB | 1193384 | 5/1970 |
| WO | WO 2007/149473 A2 | 12/2007 |

* cited by examiner

RECIRCULATING COOLING UNIT WITHIN A HOUSING

FIELD OF THE INVENTION

The present invention relates to a recirculating cooling unit comprising a plurality of components that require supervision and maintenance. More particularly, the invention relates to water cooling units for power transmission and industrial processes. The cooling unit includes several components that need regular service/maintenance, such as pumps and a heat exchanger.

PRIOR ART

A recirculating cooling unit is arranged to recirculate a liquid, usually water, to provide cooling. The cooling unit includes a plurality of components, such as pumps, motors and filters, which require regular maintenance. Thus, the cooling unit must be arranged so that it is possible to provide maintenance on all components after the cooling unit has been mounted. If the cooling unit is not provided with any walls, it is customary to arrange the cooling unit in the middle of a room in a building so that it is possible to go around the unit and to reach the components from all sides of the cooling unit.

Some cooling unit are provided with a housing including walls surrounding the components of the cooling unit. The maintenance of the components is done from the outside of the housing. To facilitate the maintenance, the housing is provided with openings, such as inspection holes, arranged so that the components that need maintenance are accessible through the inspection holes. To be able to reach each component that requires service, it is necessary to provide inspection openings in all the walls of the housing. Alternatively, the housing is arranged so that it is possible to remove the walls from the housing.

A problem with this is that it often is difficult to reach the components, and the space to carry out the maintenance of the components is tight. A further problem is that the unit must be positioned so that it is possible to walk around the unit to reach the components from three or four sides depending on the design of the unit.

US2007/0000280A1 shows a recirculation cooling system wherein all components are easily accessible for maintenance. The cooling system includes a housing provided with an open rear and is attached to a vertical side of switchgear cabinet or machine housing. The interior of the housing is divided by a separating wall into a front and a rear partial area. The rear partial area receives an evaporator, a pump and a tank. The front partial area receives a liquefier and a fan, and is connected with the surroundings via openings in the front wall. A compressor is housed in a reception area which bridges both partial areas, and is accessible through the openings in the front of the housing. The components in the rear partial area are accessible through the open rear of the housing. The front partial area is accessible through the openings arranged in the front wall of the housing. A disadvantage with this system is that it requires work space to accommodate a service technician in front of the housing as well as behind the housing. Further, more space is needed to allow the service technician to move from the front to the back side of the cooling system.

U.S. Pat. No. 3,205,674 discloses a refrigeration station having a service area designed to house a human working in the space, and components are arranged so that they are accessible from the service area. The refrigeration station is design to allow a human to enter into the station and to enter the service area.

U.S. Pat. No. 3,299,657 discloses an all-weather unit for a refrigerating and air condition system with an air cooled condenser, whereby the unit includes an internal floor area for housing a human.

OBJECTS AND SUMMARY OF THE INVENTION

One object of the present invention is to facilitate maintenance of the recirculating cooling unit. Another object of the present invention is to reduce the floor space needed for service/maintenance of the cooling unit.

This object is achieved with a cooing unit as defined in claim 1.

The cooling unit is characterized in that the interior of the cooling unit comprises an open space, in the following named a service area, designed to house a human working in the space, and the components are arranged so that they are accessible from the service area inside the cooling unit, and the cooling unit is provided with an opening arranged in communication with the service area and design to allow a human to enter into the cooling unit and move to the service area.

A service area is arranged inside the cooling unit, and the components are arranged around the service area so that they can be given maintenance by a human standing in the service area. Preferably, the size of the service area is such that a human can be standing upright inside the service area while providing maintenance of the components. All components that need to be reached during maintenance of the cooling system are positioned within reach from the service area. Thus, a service technician can carry out maintenance of the components of the cooling unit from one place, and does not have to move around the cooling unit and provide service of different components from different sides of the unit. Further, the total space needed for maintenance is significantly reduced, since no floor space outside the cooling unit needs to be reserved for maintenance. Since the service area is integrated in the cooling unit, no floor space in front of the unit or on any side of the cooling unit is required for maintenance.

The service area is arranged so that it can be easily reached from the outside of the unit through an opening in the unit. For example, an opening is arranged in a front wall of the unit. This is advantageous since all components are reachable from one side of the unit and all service/maintenance activities needed, can be made from one side of the unit, for example, from the front side. Thus the components do not have to be accessible from the other three sides. This means that the cooling unit can be built in and accordingly floor space is saved.

Having a service area integrated within the cooling unit makes the cooling unit compact and no additional service spaces is necessary. All service needed is accessible from one side of the unit.

The components comprise at least one pump and an expansion vessel. For example, the components may also include a deionizer vessel, a fine filter and a strainer. Preferably, the components are positioned around the service area on at least two sides of the service area, and more preferably on at least three sides of the service area. Thereby, the size of the service area is reduced and a compact design of the cooing unit is achieved.

According to an embodiment of the invention, the cooling unit comprises a plurality of instruments that require supervision, and the instruments are arranged visible from the service area. For example, the instruments include a flow meter, a pressure sensor, and a conductivity sensor. This embodiment makes it possible for a human to supervise the instruments of the cooling unit from the service area. Thus, maintenance and fault tracing of the cooling unit are facilitated.

According to an embodiment of the invention, the cooling unit comprises an control panel for controlling the cooling unit, and the control panel is arranged inside the housing so that it is accessible from the service area. This embodiment makes it possible for a human to control the cooling unit and its components from the service area. It is advantageous for a service technician to be able to control the components and at the same time have access to the components, for example, during startup, maintenance and fault tracing. Further, there is advantageous for the service technician to be able to supervise the instruments of the cooling unit while controlling the components of the cooling unit, for example, during startup, maintenance and fault tracing of the components. Preferably, the cooling unit includes at least one pump, which is controllable from the control panel. It is advantageous to be able to control the components, such as the pump and the valve, from the service area and at the same time see what happens due to a certain control action. Thus, startup, maintenance, and fault tracing of the cooling unit are significantly facilitated.

According to an embodiment of the invention, the components comprises at least one pump and a motor for driving the pump, and a control cubicle including equipment for providing power supply to the motor and controlling start and stop of the motor, and the control cubicle is arranged inside the cooling unit so that it is accessible from the service area. It is advantageous to be able to access the control cubicle the service area, for example, during installation of and repair of the equipment for providing power supply to the motor.

According to an embodiment of the invention, the control panel is arranged on the control cubicle such that the control panel is facing towards the service area. This embodiment reduces the size of the of the service area.

According to an embodiment of the invention, the cooling unit is built in on three sides and the front side of the cooling unit is provided with the opening. Thus, all of the components are accessible from the front side of the unit, and space is saved.

According to an embodiment of the invention, cooling unit is positioned the service area has a floor arranged in connection to the bottom frame. This embodiment facilitates for a human to enter the service area since the service area is mainly on the same level as the floor outside the cooling unit.

BRIEF DESCRIPTION OF THE DRAWINGS

The invention will now be explained more closely by the description of different embodiments of the invention and with reference to the appended figures.

DETAILED DESCRIPTION OF PREFERRED EMBODIMENTS OF THE INVENTION

Figure 1:
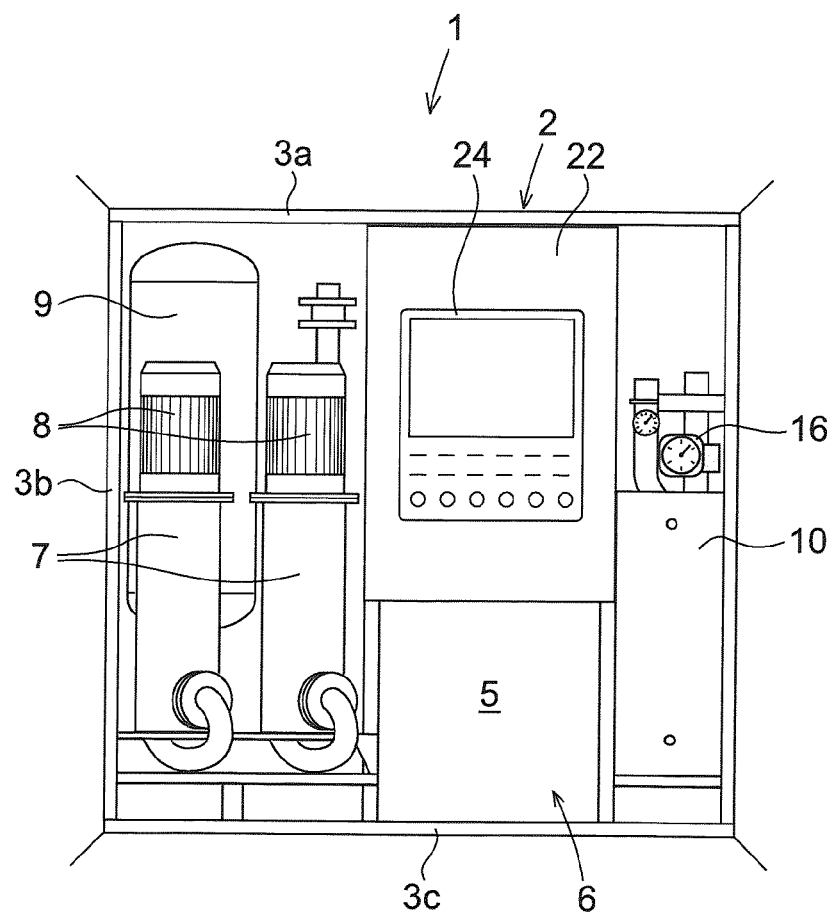
FIG. 1 shows a recirculating cooling unit according to an embodiment of the invention in a front view.
Figure 3:
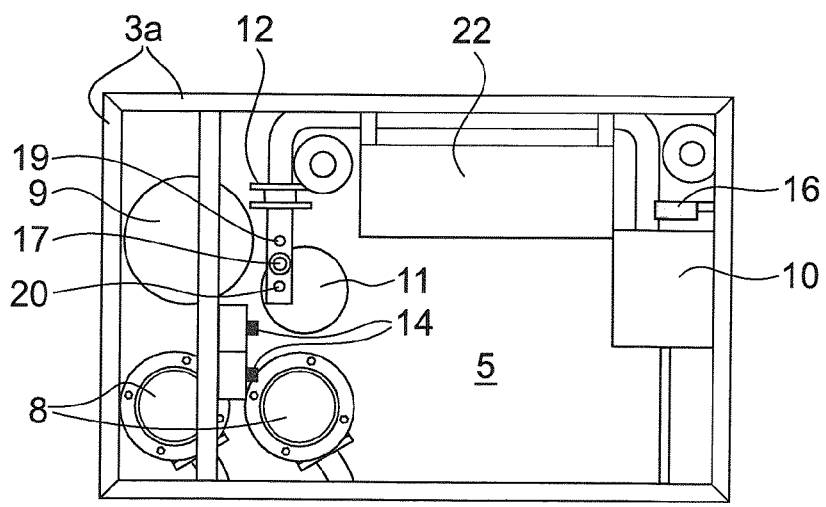
FIG. 3 shows the recirculating cooling unit shown in FIGS. 1 and 2 in a view from above.
Figure 2:
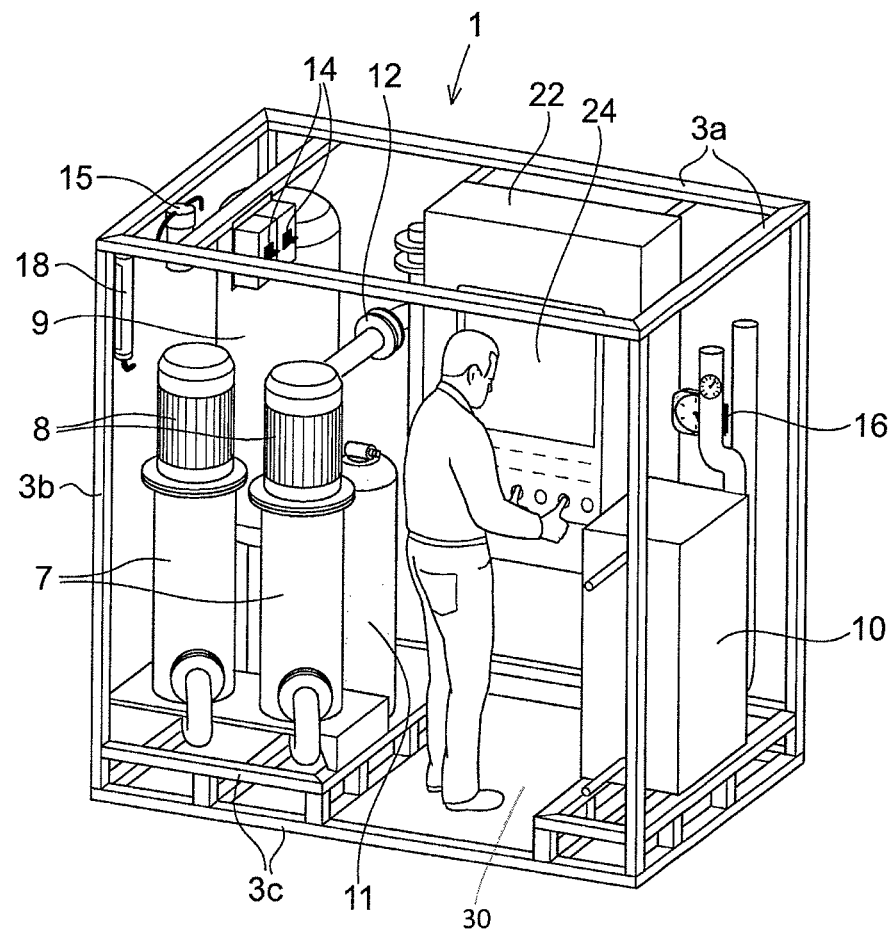
FIG. 2 shows the recirculating cooling unit shown in FIG. 1 in a perspective view.

FIG. 1 shows a recirculating cooling unit 1 according to an embodiment of the invention in a front view. FIG. 2 shows the cooling unit with the side walls removed in a perspective view, and FIG. 3 shows the cooling unit in a view from above. The cooling unit 1 includes a plurality of components that require supervision and maintenance, and is built in on three sides, which means that the cooling unit is surrounded with solid walls on three sides. The front side of the cooling unit is provided with an opening 6 design to allow a human to enter into the cooling unit. In this embodiment the entire front side of the cooling unit is open. Alternatively, the front side can be provided with a protective wall, and the protective wall can be provided with an opening, for example a door opening, to allow a human to enter into the cooling unit. In the embodiment shown in FIG. 1, the cooling unit comprises a framework 2 including top bars 3a, side bars 3b, and a bottom frame 3c. Alternatively, the framework 2 only includes the bottom frame 3c, and the side and top bars 3a-b are dispensed. The components of the cooling unit can, for example, be positioned on the bottom frame or directly on the floor of a room accommodating the cooling unit.

The cooling unit 1 comprises an open space 5 arranged inside the cooling unit, in the following named a service area, designed to house a human working in the space. All components of the cooling unit that requires service/maintenance are arranged so that they are accessible from the service area. The size of the service area should be large enough to allow at least one person to carry out service/maintenance supervision of the components of the cooling unit while seated in the service area inside the cooling unit. Preferably the height of the service area is such that a human can be allowed to stand upright during the maintenance. The service area is arranged in communication with the opening 6, to allow a human to enter into the cooling unit and move to and from the service area. Thus, all service and maintenance needed is accessible from front side of the cooling unit.

The cooling unit is positioned on the bottom frame 3c, and the service area has a floor 30 arranged in connection to the bottom frame, as shown in FIG. 2. The floor can either be a part of the floor in the building housing the cooling unit, or a separate floor connected to the bottom frame.

As shown in the figures, the components are positioned around the service area on three sides of the service area in this embodiment. This achieves a very compact design of the cooing unit. However, it is possible to position the component on only one or two sides of the service area to achieve an elongated cooling unit. It is also possible to have a few small components of the fourth side of the service area.

The number of components and the type of components differs between different cooling units. However, most recirculating cooling unit includes at least one pump, a heat exchanger and an expansion vessel. In the following, the component show in the FIGS. 1-3 will be explained in more detail. However, the invention is not limited to this type of cooling unit, but is applicable to any type of recirculating cooling unit having a size large enough to allow a human to enter into the cooling unit.

The cooling unit show in the FIGS. 1-3 includes the following components that require maintenance:

Two main circulation pumps 7. The maintenance needed for the circulation pumps is change of a mechanical sealing.

Two motors 8 for driving the main pumps. The maintenance needed for motors is, for example, change of a bearing.

An expansion tank 9. The water level and the air pressure in the expansion tank needs to be adjusted during start up and in connection with maintenance.

A heat exchanger 10, for example a plate heat exchanger. The maintenance needed, for example, includes removing and cleaning the plates.

A deionizer vessel 11, which is normally changed once a year.

A main circuit strainer 12, which is normally checked once a year.

A fine filter 15, which is normally changed once a year.

Service switches 14 for the pump motors, to enable the pumps and motors to be turned off during maintenance of the pumps of the motors.

Instead of a heat exchanger, the cooling unit may include a dry liquid cooler.

The cooling unit further comprises a plurality of instruments that require supervision, and the instruments are arranged access able and visible from the service area to allow the instruments to be read from the service area 5.

The cooling unit shown in the FIGS. 1-3 includes the following instruments that require supervision:

A flow meter 16 at raw water side,
A pressure sensor 17,
A flow meter 18 in treatment circuit,
A temperature sensor 19,
A conductivity sensor 20.

The instruments can be read, and repaired or exchanged if they are defect, by a service technician standing in the service area.

The cooling unit show in the FIGS. 1-3 further comprises a control cubicle 22 including equipment for providing power supply to the motors 8 and control equipment for controlling and supervising the cooling unit, for example, to control start and stop of the motors 8 and accordingly to control the pumps 7. The control equipment includes programmable logic, such as a PLC, a CPU or a FPGA. The control cubicle 22 is arranged inside the cooling unit so that it is accessible from the service area. The control cubical is positioned at a suitable place close to the service area so it is easily accessible from the service area. In the embodiment disclosed in FIGS. 1-3, the control cubical is positioned on an opposite side of the service area as the opening 6 for entering into the unit.

There must be a safety area in front of the control cubical and there is a demand on the length of the safety area, which must be more than 1.2 m. It is advantageous to arrange the floor in the service area on the same level as the floor in the room accommodating the cooling unit and without any doorstep. By that the safety area in front of the control cubical may extend outside the cooling unit, and may include a part of the floor of service area and a part of the floor of the floor outside the cooling unit. Thereby, it is possible for a human who has received an electric shock to step back without stumble and fall, or hit something.

The cooling unit show in the FIGS. 1-3 further comprises a control panel 24 for controlling the cooling unit, and the control panel 24 is arranged inside the cooling unit so that it is accessible from the service area 5. The control panel 24 is arranged in close vicinity to the service area, and facing towards the service area 5. In this embodiment of the invention, the control panel 24 is arranged on the control cubicle 22 such that the control panel is facing towards the service area. The control panel is a MMI to the control equipment and incudes means for achieving communication between a human in the service area and the equipment in the control cubicle 22. The control panel may include a display device, for example a touch screen, keys and buttons for controlling the components of the cooling unit, for example to start and stop the pumps 7. The control panel is in communication with the equipment in the control cubicle 22. It is thus possible for a service technician to control and supervise the cooling unit via the control panel.

Having a service area integrated within the cooling unit makes the unit compact and no additional service spaces are necessary. All service needed is accessible from front side of the cooling unit, such as Change of deionizer vessel.
Check or change of fine filter.
Cleaning of strainer in main pipe.
Changing mechanical sealing in pumps or changing complete pump.
All instruments are visible from the service zone.

The present invention is not limited to the embodiments disclosed but may be varied and modified within the scope of the following claims. For example, the size and shape of the service area may vary, as long as the size of the service area is large enough to allow at least one person to carry out maintenance of the surrounding components while located in the service area. Further, the positioning of the components in relation to the service area may vary as long as they are accessible from the service area.

The invention claimed is:

1. A cooling unit comprising: a housing; a plurality of components which require supervision and maintenance, disposed in the housing; a control cubicle disposed in the housing and including an equipment for controlling and supervising the cooling unit; a service area defined by an open space in an interior of the housing, and surrounded by the plurality of components and the control cubicle, the service area being configured to be capable of housing a human working in the open space, wherein: said plurality of components and the control cubicle are arranged so that the plurality of components and the control cubicle are accessible from the service area, and the housing is provided with an opening leading to the service area, the cooling unit is arranged to recirculate a liquid to provide cooling, the plurality of components comprise: a liquid pump configured to circulate the liquid; and a motor for driving the liquid pump, and the control cubicle includes: said equipment for providing power supply to the motor for controlling start and stop of the motor; and a control panel for controlling the cooling unit, the control panel including an electronic user interface with an electronic display device facing toward the service area and being accessible from the service area, wherein the liquid pump is controllable from said control panel, and the electronic user interface is configured to receive input from a user and provide communication to the equipment in the control cubical to enable control and supervise of the cooling unit, wherein the plurality of components is positioned around the service area on at least two sides, wherein the housing includes a bottom frame, the cooling unit is positioned on the bottom frame, and the service area has a floor arranged in connection to the bottom frame.

2. The recirculating cooling unit according to claim 1, wherein the housing includes a bottom frame, the cooling unit is positioned on the bottom frame, and the service area has a floor arranged in connection to the bottom frame.

3. The recirculating cooling unit according to claim 1, wherein the housing is built in on three sides and a front side of the housing is provided with said opening.

4. The recirculating cooling unit according to claim 1, wherein the plurality of components is positioned around the service area on at least three sides of the service area.

\* \* \* \* \*